United States Patent
Forbes (10) Patent No.: US 7,102,191 B2
(45) Date of Patent: Sep. 5, 2006

(54) MEMORY DEVICE WITH HIGH DIELECTRIC CONSTANT GATE DIELECTRICS AND METAL FLOATING GATES

(75) Inventor: Leonard Forbes, Corvallis, OR (US)

(73) Assignee: Micron Technologies, Inc., Boise, ID (US)

( * ) Notice: Subject to any disclaimer, the term of this patent is extended or adjusted under 35 U.S.C. 154(b) by 51 days.

(21) Appl. No.: 10/808,058

(22) Filed: Mar. 24, 2004

(65) Prior Publication Data

US 2005/0212033 A1  Sep. 29, 2005

(51) Int. Cl.
H01L 21/469 (2006.01)
(52) U.S. Cl. ........................ 257/315; 257/318
(58) Field of Classification Search .............. 257/315, 257/318, 319, 320
See application file for complete search history.

(56) References Cited

U.S. PATENT DOCUMENTS

| | | | |
|---|---|---|---|
| 4,184,207 A | 1/1980 | McElroy | |
| 4,420,504 A | 12/1983 | Cooper | |
| 4,755,864 A | 7/1988 | Ariizumi | |
| 4,881,114 A | 11/1989 | Mohsen | |
| 5,241,496 A | 8/1993 | Lowrey | |
| 5,330,930 A | 7/1994 | Chi | |
| 5,365,094 A * | 11/1994 | Takasu | 257/295 |
| 5,378,647 A | 1/1995 | Hong | |
| 5,379,253 A | 1/1995 | Bergemont | |
| 5,397,725 A | 3/1995 | Wolstenholme | |
| 5,467,305 A | 11/1995 | Bertin | |
| 5,576,236 A | 11/1996 | Chang | |
| 5,768,192 A | 6/1998 | Eitan | |
| 5,792,697 A | 8/1998 | Wen | |
| 5,858,841 A | 1/1999 | Hsu | |
| 5,911,106 A | 6/1999 | Tasaka | |
| 5,946,558 A | 8/1999 | Hsu | |
| 5,966,603 A | 10/1999 | Eitan | |
| 5,994,745 A | 11/1999 | Hong | |
| 6,011,725 A | 1/2000 | Eitan | |
| 6,028,342 A | 2/2000 | Chang | |
| 6,030,871 A | 2/2000 | Eitan | |
| 6,044,022 A | 3/2000 | Nachumovsky | |
| 6,081,456 A | 6/2000 | Dadashev | |
| 6,108,240 A | 8/2000 | Lavi | |
| 6,133,102 A | 10/2000 | Wu | |

(Continued)

FOREIGN PATENT DOCUMENTS

EP  84303740.9  1/1985

(Continued)

OTHER PUBLICATIONS

Min She et al., *19th IEEE Non-Volatile Semiconductor Memory Workshop 2003*, p. 53-55, "Improved SONOS-type Flash Memory Using HfO$_2$ as Trapping Layer".

(Continued)

*Primary Examiner*—David Nelms
*Assistant Examiner*—Thinh T Nguyen
(74) *Attorney, Agent, or Firm*—Leffert, Jay & Polglaze P.A.

(57) ABSTRACT

A memory cell transistor includes a high dielectric constant tunnel insulator, a metal floating gate, and a high dielectric constant inter-gate insulator comprising a metal oxide formed over a substrate. The tunnel insulator and inter-gate insulator have dielectric constants that are greater than silicon dioxide. Each memory cell has a plurality of doped source/drain regions in a substrate. A pair of transistors in a row are separated by an oxide isolation region comprising a low dielectric constant oxide material. A control gate is formed over the inter-gate insulator.

5 Claims, 3 Drawing Sheets

U.S. PATENT DOCUMENTS

| | | |
|---|---|---|
| 6,134,156 A | 10/2000 | Eitan |
| 6,147,904 A | 11/2000 | Liron |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,327,174 B1 | 12/2001 | Jung |
| 6,348,711 B1 | 2/2002 | Eitan |
| 6,392,930 B1 | 5/2002 | Jung |
| 6,417,053 B1 | 7/2002 | Kuo |
| 6,421,275 B1 | 7/2002 | Chen |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 | 11/2002 | Chang |
| 6,487,050 B1 | 11/2002 | Liu |
| 6,498,377 B1 | 12/2002 | Lin |
| 6,514,831 B1 | 2/2003 | Liu |
| 6,531,887 B1 | 3/2003 | Sun |
| 6,545,309 B1 | 4/2003 | Kuo |
| 6,552,387 B1 | 4/2003 | Eitan |
| 6,559,013 B1 | 5/2003 | Pan |
| 6,576,511 B1 | 6/2003 | Pan |
| 6,580,135 B1 | 6/2003 | Chen |
| 6,580,630 B1 | 6/2003 | Liu |
| 6,599,801 B1 | 7/2003 | Chang et al. |
| 6,602,805 B1 | 8/2003 | Chang |
| 6,607,957 B1 | 8/2003 | Fan |
| 6,610,586 B1 | 8/2003 | Liu |
| 6,613,632 B1 | 9/2003 | Liu |
| 6,617,204 B1 | 9/2003 | Sung |
| 6,660,588 B1 * | 12/2003 | Yang et al. ............ 438/257 |
| 6,784,483 B1 | 8/2004 | Chen |
| 6,830,963 B1 | 12/2004 | Forbes |
| 6,838,869 B1 | 1/2005 | Rogers et al. |
| 2001/0001075 A1 | 5/2001 | Ngo |
| 2001/0004332 A1 | 6/2001 | Eitan |
| 2001/0011755 A1 | 8/2001 | Tasaka |
| 2001/0045594 A1 | 11/2001 | Chang |
| 2002/0055230 A1 | 5/2002 | Chang |
| 2002/0086548 A1 | 7/2002 | Chang |
| 2002/0142569 A1 | 10/2002 | Chang |
| 2002/0146885 A1 | 10/2002 | Chen |
| 2002/0151138 A1 | 10/2002 | Liu |
| 2002/0177275 A1 | 11/2002 | Liu |
| 2002/0182829 A1 | 12/2002 | Chen |
| 2003/0032224 A1 | 2/2003 | Sung et al. |
| 2003/0057997 A1 | 3/2003 | Sun |
| 2003/0067807 A1 | 4/2003 | Lin |
| 2003/0117861 A1 | 6/2003 | Maayan |
| 2003/0183870 A1 | 10/2003 | Sugiyama |
| 2003/0211690 A1 | 11/2003 | Chung |
| 2004/0043622 A1 | 3/2004 | Chen |

FOREIGN PATENT DOCUMENTS

| | | |
|---|---|---|
| EP | 90115805.5 | 2/1991 |
| EP | 01113179.4 | 12/2002 |

OTHER PUBLICATIONS

Shin et al., *19th IEEE Non-Volatile Semiconductor Memory Workshop 2003*, p. 58-59, "High Reliable SONOS-type NAND Flash Memory Cell with $Al_2O_3$ for Top Oxide".

Blomme et al., *19th IEEE Non-Volatile Semiconductor Memory Workshop 2003*, p. 93-94, "A Novel Low Voltage Memory Device with an Engineered $SiO_2$ /high-k tunneling barrier".

Lusky et al., (Nov.) 2001, *IEEE Electron Device Letters*, vol. 22, No. 11, p. 556-558, "Characterization of Channel Hot Electron Injection by the Subthreshold Slope . . . ".

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide-Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, date unknown.

T. Sugizaki, et al. "New 2-bit/Tr MONOS Type Flash Memory using Al$_2$O$_3$ as Charge Trapping Layer," Fujitsu Laboratories Ltd, date unknown.

T. Saito, et al. "Hot Hole Erase Characteristics and Reliability in Twin MONOS Device" Halo LSI, date unknown.

Saifun Semiconductors, LTD. PowerPoint Presentation, date unknown.

Y. Roizin, et al. "Novel Techniques for data retention and Leff measurements in two bit MicroFlash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al. "Subthreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., date unknown.

L. Breuil, et al., "A new 2 isolated-bits/cell flash memory device with self aligned split gate structure using ONO stacks for charge storage," IMEC, date unknown.

J. Willer, et al., "UMEM: A U-shape Non-Volatile-Memory Cell," Ingentix GmbH &Co. KG., Infineon Technologies and Saifun Semiconductors, date unknown.

S. Kang, et al., "A Study of SONOS Nonvolatile Memory Cell Controlled Structurally by Localizing Charge-Trapping Layer," Samsung Electrons Co., Ltd., date unknown.

Y. Roizin, et al., "In-Process Charging in microFLASH® Memory Cells," Tower Semiconductor, Ltd., date unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, date unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., date unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, date unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., date unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, date unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, date unknown.

Y. Roizin, et al., "Retention Characteristics of microFLASH® Memory (Activation Energy of Traps in the ONO Stack)," Tower Semiconductor, Ltd., date unknown.

Y. Roizin, et al., "Activation Energy of Traps in the ONO Stack of microFLASH® Memory Cells," Tower Semiconductor, Ltd., date unknown.

Y. Roizin, et al., "Dummy Gox for Optimization of microFLASH® Technology," Tower Semiconductor, Ltd., date unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI, date unknown.

J. Bu, et al., "Retention Reliability Enhanced SONOS NVSM with Scaled Programming Voltage," Microelectronics Lab., date unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

\* cited by examiner

MEMORY DEVICE WITH HIGH DIELECTRIC CONSTANT GATE DIELECTRICS AND METAL FLOATING GATES

TECHNICAL FIELD OF THE INVENTION

The present invention relates generally to memory devices and in particular the present invention relates to flash memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Stray capacitance in flash memory cells can cause problems. For example, the capacitance between different floating gates that are close together can cause coupling and cross-talk between the floating gates of neighboring cells. This may also have the effect of reducing memory cell performance.

Figure 1:
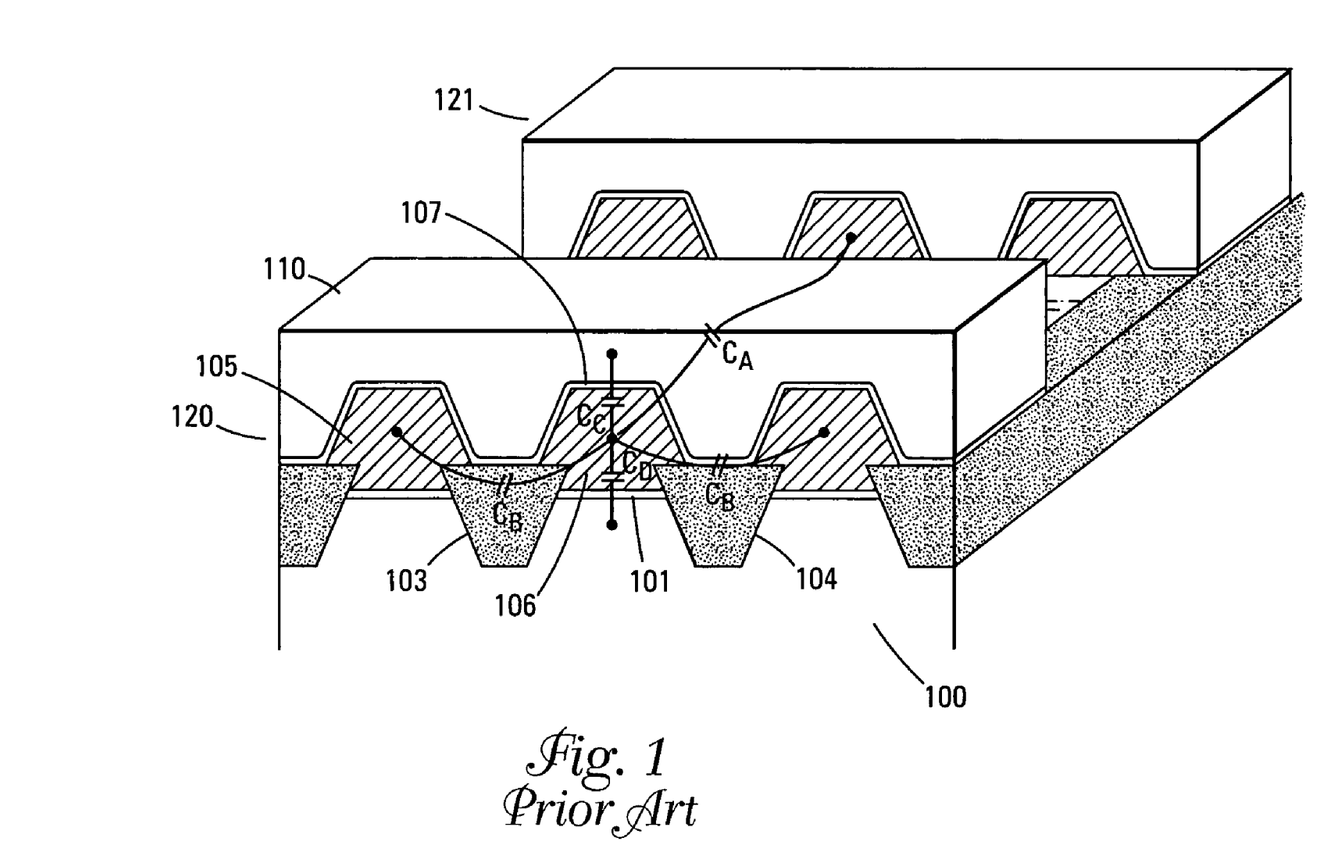
FIG. 1 shows a cross-sectional view of a typical prior art flash memory cell transistor array showing stray capacitances.

FIG. 1 illustrates a cross-sectional view of a typical prior art memory cell array. A typical cell is comprised of a silicon substrate 100. A gate insulator layer 101 is formed on top of the substrate 100. Oxide isolation areas 103 and 104 are formed between the cells. The floating gates 105 and 106 are formed between the oxide isolation areas 103 and 104. An interpoly insulator 107 is formed over the floating gates 105 and 106 prior to forming the control gate 110 on top. The memory array is comprised of multiple rows 120 and 121 of memory cell transistors.

The capacitances that couple the various components of the array are illustrated as $C_{A-D}$. $C_A$ is the row-to-row floating gate stray capacitance. $C_B$ is the end-to-end floating gate stray capacitance. $C_C$ is the floating gate-to-control gate coupling capacitance and $C_D$ is the floating gate-to-substrate coupling capacitance.

The ratio of these capacitive components is determined by the geometrical dimensions of the facing surfaces constituting the capacitance and the dielectric constants of the insulator materials. The ends and sides of the floating gates are the plate areas of the stray capacitances. The dielectrics between the side and end areas are the oxide and have the same dielectric constant as the gate oxide. In the case of NAND flash memory devices, the polysilicon floating gate material is thick resulting in large surfaces on the ends and sides of the floating gates. The thick floating gate material results in greater stray capacitances.

For the reasons stated above, and for other reasons stated below which will become apparent to those skilled in the art upon reading and understanding the present specification, there is a need in the art for a flash memory cell transistor that has reduced stray capacitance and, therefore, higher performance.

SUMMARY

The above-mentioned problems with stray capacitance and other problems are addressed by the present invention and will be understood by reading and studying the following specification.

The present invention encompasses a flash memory transistor with a high permittivity gate dielectric and metal floating gate to reduce the effect of stray capacitances. The memory transistor comprises a substrate that has a plurality of source/drain regions. The source/drain regions have a different conductivity type than the remainder of the substrate.

A metal floating gate is formed overlying the substrate. In one embodiment, the floating gate is formed over a high dielectric constant tunnel insulator. A metal oxide inter-gate insulator is formed over the metal floating gate. The inter-gate insulator and the tunnel insulator each have a dielectric constant that is greater than a dielectric constant of silicon dioxide. A control gate is formed on top of the inter-gate insulator layer. In one embodiment, the control gate is metal.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

In the subsequent discussion of the embodiments of the present invention, high dielectric constant (high-k) materials are considered to have dielectric constants that are greater than that of silicon dioxide (i.e., k=3.9). Alternate embodiments define high-k materials with different dielectric constants.

Figure 2:
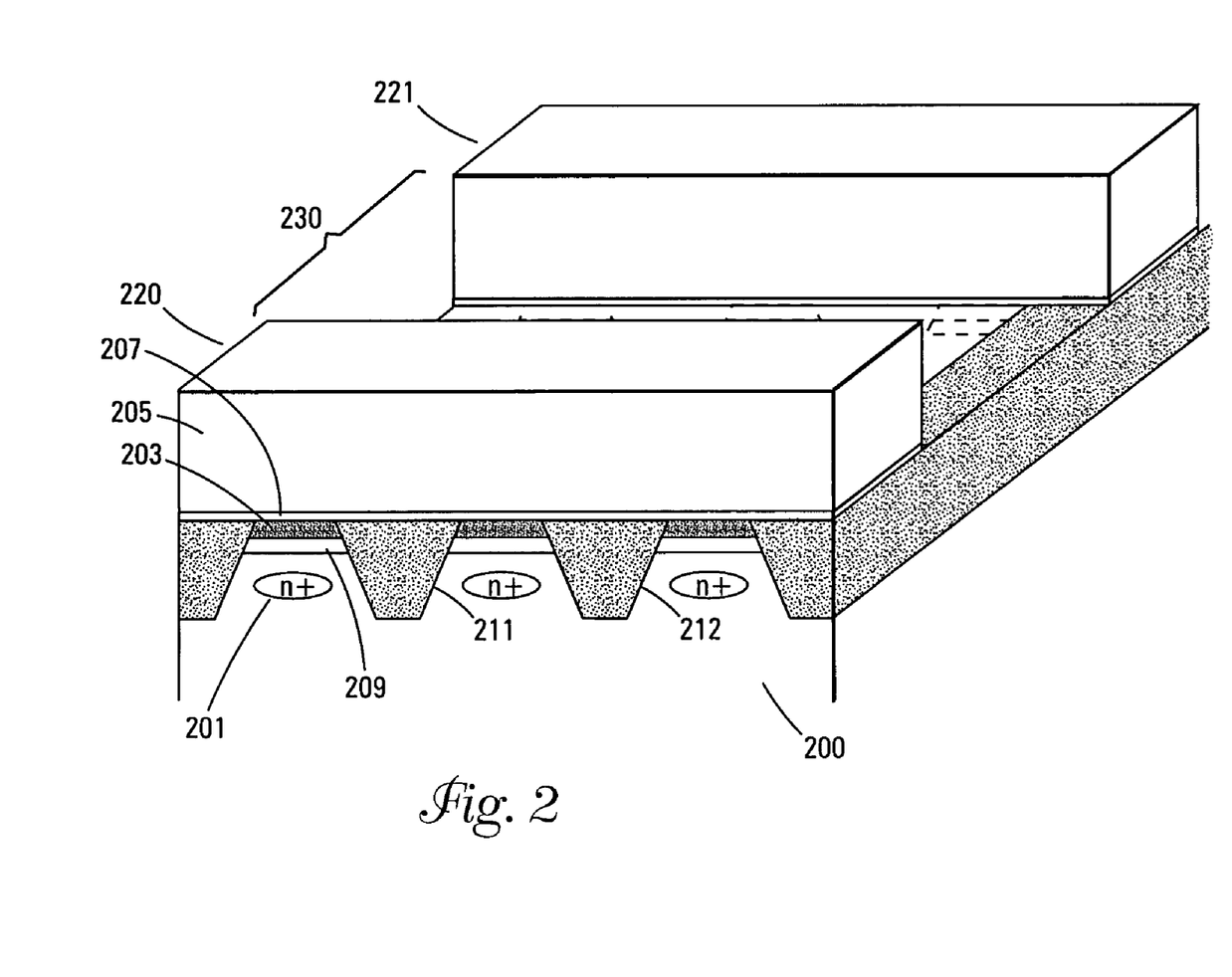
FIG. 2 shows a cross-sectional view of one embodiment of a flash memory cell transistor array of the present invention.

FIG. 2 illustrates a cross-sectional view of one embodiment of a NAND flash memory cell transistor array of the present invention. Each transistor is comprised of a high dielectric constant (high-k) tunnel insulator, a metal floating gate, and a high-k inter-gate insulator. Examples of gate structure embodiments of the present invention include a deposited aluminum oxide—aluminum floating gate—aluminum oxide grown by low temperature oxidation—aluminum control gate, deposited aluminum oxide—aluminum floating gate—deposited aluminum oxide—aluminum control gate, and PbO grown by oxidation of Pb—Pb—PbO grown by oxidation of Pb. These embodiments are for purposes of illustration only since the present invention is not limited to any one structure.

Referring to FIG. 2, each transistor of the array is comprised of two source/drain regions 201 that are doped into a silicon substrate 200. The second source/drain region is not shown but is located along the z-axis behind the first source/drain region 201. Since the illustrated embodiment is a NAND architecture array, the second transistor row 221 behind the first row 220 shares the second source/drain region. In one embodiment, the source/drain regions are n+regions and the substrate is p-type silicon. However, the present invention is not limited to any conductivity type.

Additionally, the present invention is not limited to NAND-type memory arrays. Alternate embodiments may use NOR architecture arrays or other types of flash memory architectures.

A high-k tunnel oxide layer 209 is formed on the substrate 200 over the source/drain regions 201 and between low dielectric constant oxide isolation areas 211 and 212. The isolation areas 211 and 212 are formed in the substrate and separate the columns of the memory array.

The metal floating gate/trapping layer 203 is formed on top of the tunnel oxide layer 209 and a high-k, metal oxide inter-gate insulator layer 207 is formed on top of the trapping layer 203. The high-k oxide—metal floating gate—high-k oxide layers 209, 203, and 207 form a composite gate insulator under the control gate 205. The control gate 205 can be comprised of a polysilicon and/or metal. Alternate embodiments use other semiconductor materials for the control gate.

The rows 220 and 221 of the memory array are separated by a low dielectric constant oxide isolation material 230. Similarly, the columns of the array are separated by the low dielectric constant oxide isolation areas 211 and 212.

In one embodiment, the high-k tunnel dielectric 209 may be formed by deposition techniques. The inter-metal insulator layer 207 may be formed by low temperature oxidation of metals. The metal floating gate 203 can be deposited on the tunnel dielectric 209 using atomic layer deposition (ALD), evaporation, sputtering, or other techniques. These techniques for forming the various layers of the transistor are for purposes of illustration only. Alternate embodiments can use other techniques.

Single layers of $Ta_2O_5$, $TiO_2$, $ZrO_2$, $Nb_2O_5$, or similar transition metal oxides can be formed by low temperature oxidation of numerous transition metal films. Examples of such operations are discussed subsequently. These metal oxide layers can also be formed by ALD, chemical vapor deposition (CVD), and sputtering.

For purposes of illustration, typical composite gate insulator structures can include $Ta_2O_5$—Ta—$Ta_2O_5$, $TiO_2$—Ti—$TiO_2$, $ZrO_2$—Zr—$ZrO_2$, and $Nb_2O_5$—Zr—$Nb_2O_5$. In each of these, the metal oxide can be deposited or grown. Alternate embodiments may use other compositions.

The oxide growth rate and limiting thickness increases with oxidation temperature and oxygen pressure. The oxidation kinetics of a metal may, in some cases, depend on the crystallographic orientations of the very small grains of metal that comprise the metal films of the present invention. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. Metal orientation effects, if present, would be larger when only a limited fraction of the metal will be oxidized and unimportant when most or all of the metal is oxidized.

As is well known in the art, ALD is based on the sequential deposition of individual monolayers or fractions of a monolayer in a well-controlled manner. Gaseous precursors are introduced one at a time to the substrate surface. Between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor.

The most commonly used oxygen source materials for ALD are water, hydrogen peroxide, and ozone. Alcohols, oxygen and nitrous oxide have also been used. Of these, oxygen reacts very poorly at temperatures below 600° C. but the other oxygen sources are highly reactive with most of the metal compounds listed above.

Source materials for the above-listed metals include: zirconium tetrachloride ($ZrCl_4$) for the Zr film, titanium tetraisopropoxide ($Ti(OCH(CH_3)_2)_4$) for the Ti film, trimethyl aluminum ($Al(CH_3)_3$) for the Al film. Alternate embodiments use other source materials.

Thin oxide films are deposited at a temperature that is high enough such that, when it is adsorbed to the substrate surface, the vaporized source material reacts with a molecular layer of a second source material or that the vaporized source material becomes adsorbed and reacts with the second source material directed to the substrate surface in the subsequent step. On the other hand, the temperature should be low enough such that thermal breakdown of the source material does not occur or that its significance in terms of the total growth rate of the film is very small. Regarding the above-listed metals, the ALD process is carried out at a temperature range of approximately 200–600° C. Alternate embodiments use other temperature ranges.

In another embodiment of the memory transistor of the present invention, the metal floating gate and high-k metal oxide insulator layers can be fabricated using evaporation techniques. Various evaporation techniques are subsequently described for some of the high dielectric constant materials listed above.

Very thin films of $TiO_2$ can be fabricated with electron-gun evaporation from a high purity $TiO_2$ slug (e.g., 99.9999%) in a vacuum evaporator in the presence of anion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3–4 in. in diameter) is located above the electron gun and argon gas is used to generate Ar ions to bombard the substrate surface uniformly during the film deposition to compact the growing $TiO_2$ film.

A two step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°–200° C.). Since there is no plasma and ion bombardment of the substrate, the original atomically smooth surface of the silicon substrate is maintained. The second step is the oxidation to form the desired $ZrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

Using a Pb/PbO structure, the Lead Oxide (PbO) barrier may be controllably grown on deposited lead films using either thermal oxidation or RF sputter etching in an oxygen plasma. One processing sequence using such a thermal oxidation process includes starting with a clean polysilicon substrate and depositing a clean lead film on the oxide gate insulator at about 25° C. to 75° C. in a clean vacuum system. In one embodiment, the base pressure is approximately $10^{-8}$ Torr or lower. The Pb film will have a thickness within 1–2 Å of its target value.

In one embodiment, lead and other metal films are deposited by a physical sputtering process. The sputtering process offers the ability to produce smoother films by increasing the re-sputtering-to-deposition ratio since re-sputtering preferentially reduces geometric high points of the film.

A low temperature oxidation process is then used to grow an oxide film of self-limited thickness. In one embodiment, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 Å as determined via in situ ellipsometric or ex situ measurements of Josephson tunneling currents. This control over tunnel current is due to the excellent control over PbO thickness that can be achieved by low temperature oxidation.

For example, increasing the oxidation time from 100 to 1,000 minutes at an oxygen pressure of 750 Torr at 25° C. only raises the PbO thickness by 3 Å (e.g., from about 21 Å to 24 Å). Accordingly, controlling the oxidation time to within 1 out of a nominal 100 minute total oxidation time provides a thickness that is within 0.1 Å of 21 Å. The PbO has a highly stoichiometric composition throughout its thickness as evidenced from ellipsometry and the fact that the tunnel barrier heights are identical for Pb/PbO structures.

Next, the system is re-evacuated and the top lead electrode is deposited. This produces a tunnel structure having virtually identical tunnel barriers at both Pb/O interfaces. The temperature used to subsequently deposit the polysilicon control gate is not critical. The PbO is stable to over 500° C. and thus introduces no temperature constraints on subsequent processes.

In another embodiment, $Al/Al_2O_3$ structures can be formed where the oxide is grown by low temperature oxidation in molecular or plasma oxygen. Capacitance and tunnel measurements indicate that the $Al_2O_3$ thickness increases with the log(oxidation time). This is similar to that found for Pb/PbO as well as other oxide/metal systems.

Additionally, tunnel currents for an $Al_2O_3$ tunnel barrier are asymmetrical with somewhat larger currents flowing when electrons are injected from the $Al/Al_2O_3$ interface that is developed during oxide growth. This asymmetry is due to a minor change in the composition of the growing oxide. There is a small concentration of excess metal in the $Al_2O_3$, the concentration of which diminishes as the oxide is grown thicker. The excess Al ions produce a space charge that lowers the tunnel barrier at the inner interface. The oxide composition at the outer $Al/Al_2O_3$ contact is much more stoichiometric and thus has a higher tunnel barrier. In spite of this minor complication, $Al/Al_2O_3$ tunneling barriers can be formed that produce predictable and highly controllable tunnel currents that can be ejected from either electrode. The magnitude of the currents is still primarily dominated by $Al_2O_3$ thickness that can be controlled via the oxidation parametrics.

In one embodiment of the present invention, $Al_2O_3$ metal oxide dielectrics can be formed by first thermally oxidizing the aluminum. In other embodiments, the aluminum is plasma oxidized or other oxidation methods can be used. Since the melting point of aluminum is much higher than lead, the formation of the $Al/Al_2O_3$ structures are typically simpler than that used for the above-described Pb/PbO junctions.

In the $Al_2O_3$ metal dielectric process of the present invention, the aluminum is sputter deposited on an oxide or other insulator at a temperature in the range of approximately 25° C. to 150° C. Due to thermodynamic forces, the micro-crystals of the face centered cubic (f.c.c.) aluminum will have a strong and desirable preferred orientation.

The aluminum is then oxidized in situ in molecular oxygen using temperature, pressure, and time to obtain the desired $Al_2O_3$ thickness. As with the lead oxide, the thickness of the aluminum increases with log(time) and can be controlled via time at a fixed oxygen pressure and temperature to within 0.10 Å when averaged over a large number of aluminum grains that are present under the counter-electrode. The thickness of the $Al_2O_3$ can be easily changed from about 15 Å to 35 Å by using appropriate oxidation parametrics. The oxide will be amorphous and remain so until temperatures in excess of 400° C. are reached. The initiation of re-crystallization and grain growth can be suppressed, if desired, by the addition of small amounts of glass forming elements (e.g., Si) without altering the growth kinetics or barrier heights significantly.

The system is then re-evacuated and a layer of aluminum is deposited over the oxidized $Al_2O_3$ layer. Finally, the polysilicon control gate layer is formed, using conventional processes that are well known in the art, on the layer of aluminum.

In additional embodiments, single layers of $Ta_2O_5$, $TiO_2$, $ZrO_2$, $Nb_2O_5$ and similar transition metal oxides can be formed by low temperature oxidation of transition metal films in molecular and plasma oxygen. They can also be formed by RF sputtering in an oxygen plasma or using other methods.

These metals oxidize via logarithmic kinetics to reach thicknesses of a few angstroms to tens of thousands of angstroms in a temperature range of 100° C. to 300° C. Excellent oxide barriers for Josephson tunnel devices can be formed by RF sputter etching these metals in an oxygen plasma.

Lower temperature oxidation approaches of the present invention differ considerably from Metal-Organic Chemical Vapor Deposition (MOCVD) processes that are used to produce transition metal oxides. The MOCVD films typically require high temperature oxidation treatments to remove carbon impurities, improve oxide stoichiometry, and produce re-crystallization. Such high temperature treatments might also cause unwanted interactions between the oxide and the underlying silicon and, thus, necessitate the introduction of interfacial barrier layers.

In the processes of the present invention, control over the properties of the various transition metal oxides is improved from the prior art due to the limited thicknesses (approximately 10 Å to 100 Å) of metal that precludes the formation of significant quantities of unwanted sub-oxide films. This is due to thermodynamic forces driving the oxide compositions to their most stable oxidized state. In one embodiment, the duplex oxide layers are still crystallized. Such treatments can be done by RTP and will be shorter than those used on MOCVD and sputter deposited oxides since the stoichiometry and purity of the low temperature oxides need not be adjusted at high temperatures.

The above-described processes for low temperature oxidation of various metals are for purposes of illustration only. The present invention is not limited to any one process for low temperature oxidation.

The embodiments of the present invention might also employ low temperature oxidation and short thermal treatments in an inert ambient atmosphere at 700° C. in order to form a range of perovskite oxide films from parent alloy films. The dielectric constants of crystallized perovskite oxides can be very large (i.e., 100 to 1000). The transition metal layers can be either pure metals or alloys and the transition metals have similar metallurgy to their oxides. In contrast, the parent alloy films that can be converted to a perovskite oxide are typically comprised of metals having widely different chemical reactivities with oxygen and other common gasses.

If an alloy is to be completely oxidized, then thin film barriers such as Pd, Pt, or their conductive oxides should be added between the silicon and the parent metal film to serve as electrical contact layers, diffusion barriers, and oxidation stops. If the perovskite parent alloy film is only partially oxidized and covered with a second layer of the parent alloy, then the barrier heights will represent that developed during oxide growth at the parent perovskite alloy/perovskite oxide interface.

Figure 3:
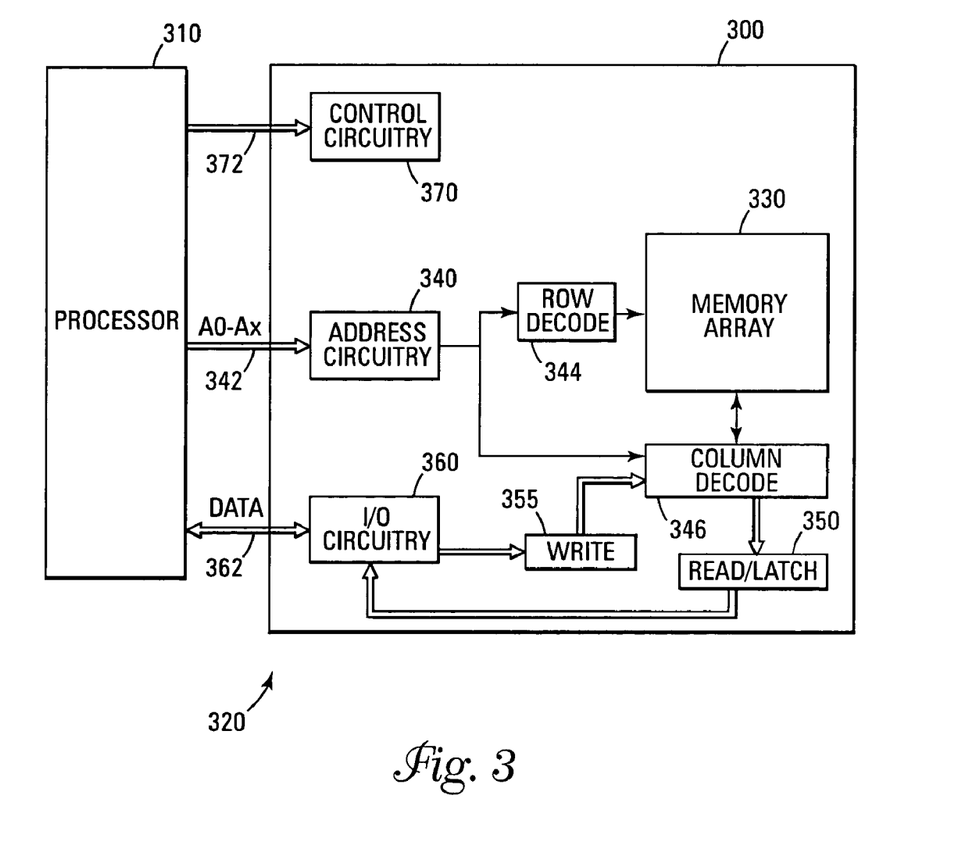
FIG. 3 shows a block diagram of an electronic system of the present invention.

FIG. 3 illustrates a functional block diagram of a memory device 300 that can incorporate the flash memory cells of the present invention. The memory device 300 is coupled to a processor 310. The processor 310 may be a microprocessor or some other type of controlling circuitry. The memory device 300 and the processor 310 form part of an electronic system 320. The memory device 300 has been simplified to focus on features of the memory that are helpful in understanding the present invention.

The memory device includes an array of the flash memory cells 330 that can be flash memory cells incorporating metal floating gates and high-k inter-gate dielectrics formed by low temperature oxidation of metals. The memory array 330 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 340 is provided to latch address signals provided on address input connections A0–Ax 342. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense/buffer circuitry 350. The sense/buffer circuitry, in one embodiment, is coupled to read and latch a row of data from the memory array 330. Data input and output buffer circuitry 360 is included for bi-directional data communication over a plurality of data connections 362 with the controller 310. Write circuitry 355 is provided to write data to the memory array.

Control circuitry 370 decodes signals provided on control connections 372 from the processor 310. These signals are used to control the operations on the memory array 330, including data read, data write, and erase operations. The control circuitry 370 may be a state machine, a sequencer, or some other type of controller.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, a flash memory cell transistor is comprised of a metal floating gate and a high-k inter-gate dielectric formed by low temperature oxidation of metals. Such construction provides thinner floating gates and, therefore, higher coupling capacitances between the floating gate and control gate and between the floating gate and substrate. The low-k dielectric isolation material between the array rows provides low stray capacitances for row-to-row floating gate capacitances and end-to-end capacitances.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory transistor comprising:
a substrate having a plurality of source/drain regions, the source/drain regions having a different conductivity type than the remainder of the substrate;
a composite gate insulator layer overlying the substrate;
a metal floating gate overlying the gate insulator, wherein an upper portion of the metal floating gate is oxidized, thereby defining a metal oxide inter-gate insulator layer; and
a control gate formed on top of the inter-gate insulator layer
wherein the composite gate insulator layer is comprised of aluminum oxide-aluminum-aluminum oxide wherein the aluminum oxide layer is the oxidized portion of the floating gate.

2. The transistor of claim 1 wherein the aluminum oxide is grown by low temperature oxidation.

3. The transistor of claim 1 wherein the composite gate insulator layer is comprised of deposited aluminum oxide-aluminum-deposited aluminum oxide.

4. The transistor of claim 1 wherein the composite gate insulator layer is comprised of PbO—Pb—PbO wherein the upper PbO layer is the oxidized upper portion of the Pb layer.

5. The transistor of claim 1 wherein the control gate is comprised of a metal.

* * * * *